(12) United States Patent
Ahn et al.

(10) Patent No.: US 12,270,828 B2
(45) Date of Patent: Apr. 8, 2025

(54) PROBE CARD

(71) Applicant: POINT ENGINEERING CO., LTD., Chungcheongnam-do (KR)

(72) Inventors: Bum Mo Ahn, Gyeonggi-do (KR); Seung Ho Park, Gyeonggi-do (KR); Sung Hyun Byun, Gyeonggi-do (KR)

(73) Assignee: POINT ENGINEERING CO., LTD., Chungcheongnam-do (KR)

( * ) Notice: Subject to any disclaimer, the term of this patent is extended or adjusted under 35 U.S.C. 154(b) by 115 days.

(21) Appl. No.: 17/919,742

(22) PCT Filed: Apr. 20, 2021

(86) PCT No.: PCT/KR2021/004936
§ 371 (c)(1),
(2) Date: Oct. 18, 2022

(87) PCT Pub. No.: WO2021/215786
PCT Pub. Date: Oct. 28, 2021

(65) Prior Publication Data
US 2023/0160926 A1    May 25, 2023

(30) Foreign Application Priority Data
Apr. 22, 2020   (KR) ........................ 10-2020-0048645

(51) Int. Cl.
*G01R 1/073* (2006.01)
*G01R 31/28* (2006.01)

(52) U.S. Cl.
CPC ..... *G01R 1/07342* (2013.01); *G01R 1/07378* (2013.01); *G01R 1/07371* (2013.01); *G01R 31/2886* (2013.01)

(58) Field of Classification Search
CPC ... G01R 1/00; G01R 1/02; G01R 1/06; G01R 1/067; G01R 1/073; G01R 1/07307;
(Continued)

(56) References Cited

U.S. PATENT DOCUMENTS 10,652,987 B2 *   5/2020   Wang ........................ H05F 3/02
11,808,787 B2 *   11/2023   Tseng ................. G01R 1/07328
(Continued)

FOREIGN PATENT DOCUMENTS

JP        2007171140       7/2007
KR        101167509        7/2012
(Continued)

OTHER PUBLICATIONS

"International Search Report (Form PCT/ISA/210) of PCT/KR2021/004936", mailed on Jul. 23, 2021, pp. 1-2.
(Continued)

*Primary Examiner* — Hoai-An D. Nguyen
(74) *Attorney, Agent, or Firm* — JCIPRNET

(57) ABSTRACT

Proposed is a probe card. The probe card according to the present disclosure includes: a circuit board; a probe head having a guide plate, and through which a plurality of probes pass; and a connection member electrically connecting the circuit board and the probes to each other, wherein an insulating part of the connection member and the guide plate are made of an anodic aluminum oxide film formed by anodizing a metal as a base material.

3 Claims, 7 Drawing Sheets

(58) Field of Classification Search
CPC .......... G01R 1/07314; G01R 1/07342; G01R 1/07364; G01R 1/07371; G01R 1/07378; G01R 31/00; G01R 31/28; G01R 31/2851; G01R 31/2855; G01R 31/286; G01R 31/2863; G01R 31/2886
See application file for complete search history.

(56) References Cited

U.S. PATENT DOCUMENTS

| | | | |
|---|---|---|---|
| 2010/0176831 A1* | 7/2010 | Palcisko | G01R 1/07357 324/756.03 |
| 2011/0043239 A1 | 2/2011 | Tomita et al. | |
| 2016/0274147 A1 | 9/2016 | Hsu et al. | |
| 2021/0307160 A1* | 9/2021 | Ahn | G01R 3/00 |
| 2021/0337674 A1* | 10/2021 | Ahn | H05K 3/4015 |

FOREIGN PATENT DOCUMENTS

| | | |
|---|---|---|
| KR | 20170139321 | 12/2017 |
| TW | 201531715 | 8/2015 |
| TW | 201805636 | 2/2018 |

OTHER PUBLICATIONS

"Office Action of Taiwan Counterpart Application", issued on May 23, 2024, with English translation thereof, pp. 1-12.

\* cited by examiner

[Fig. 2B]
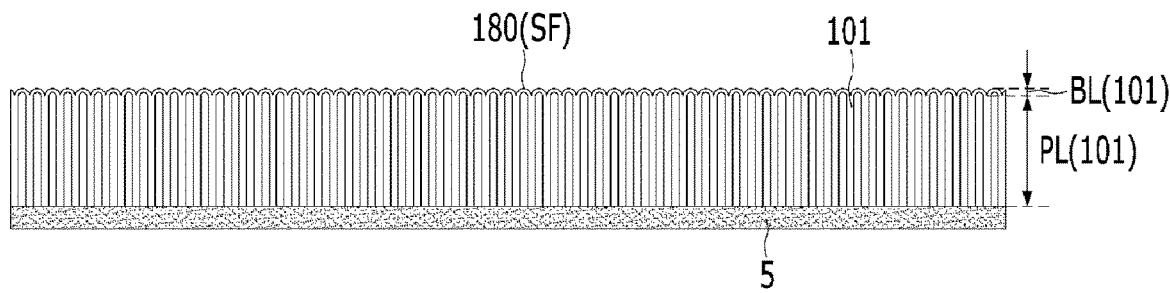
[Fig. 2C]
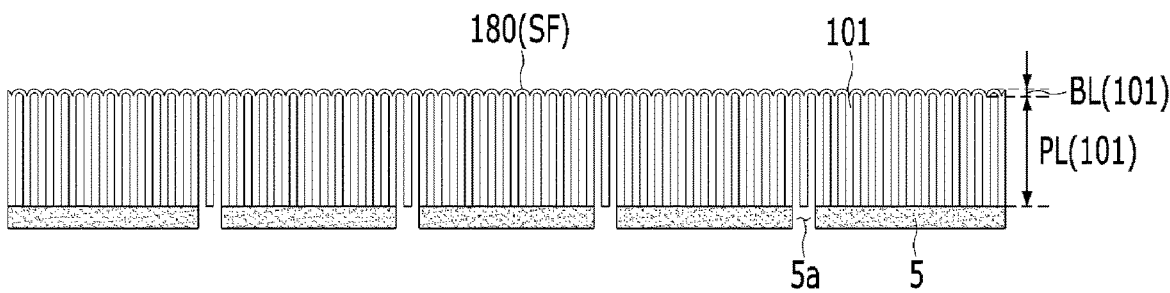
[Fig. 2D]
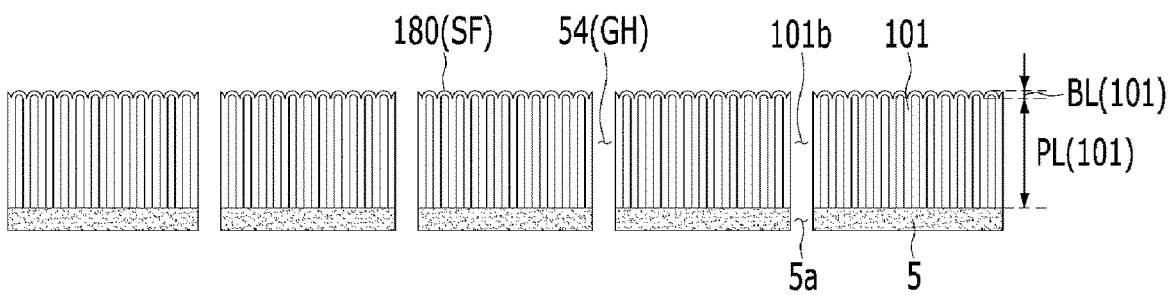
[Fig. 3]
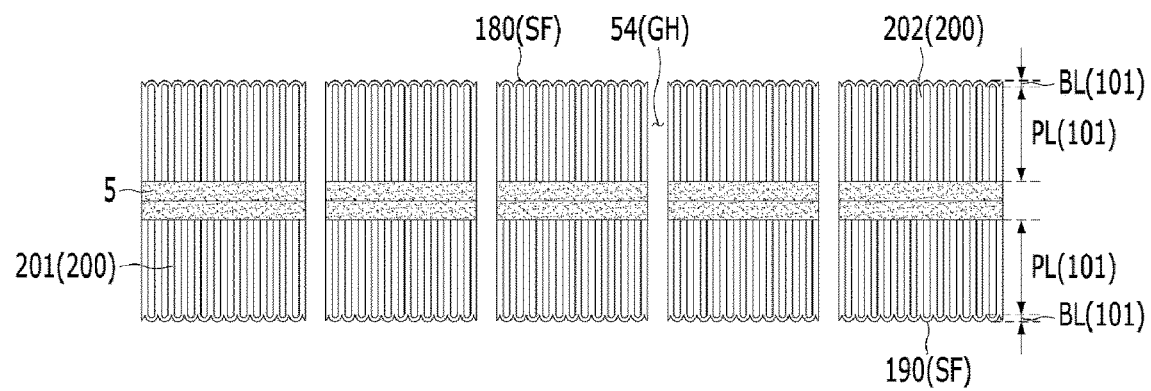

[Fig. 4A]
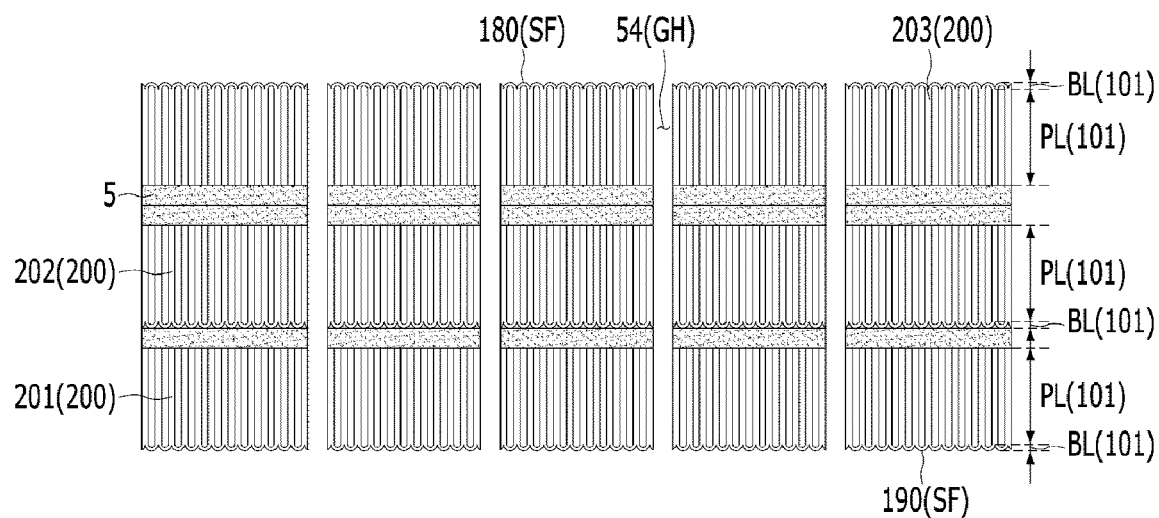
[Fig. 4B]
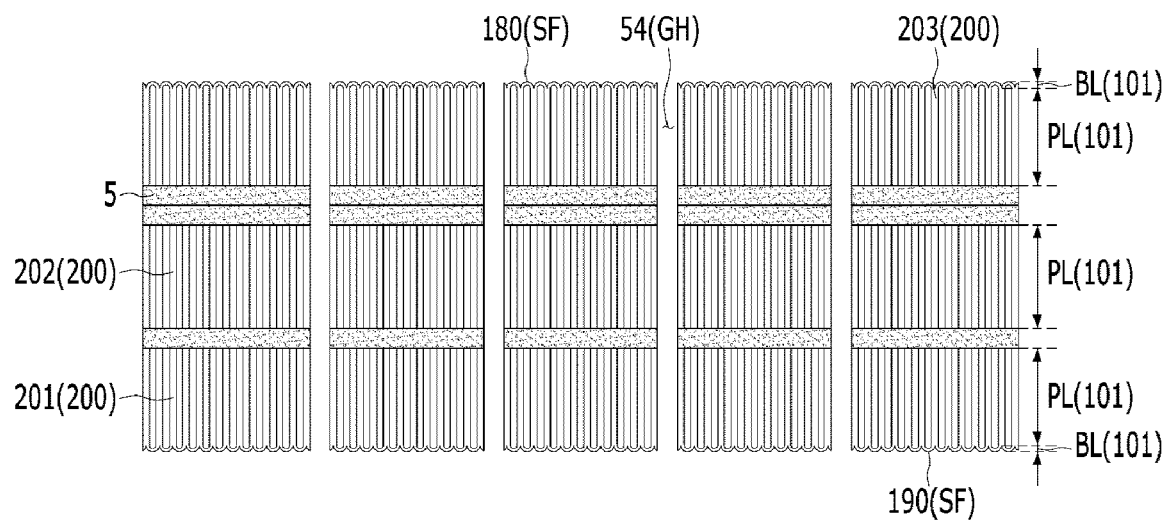

PROBE CARD

TECHNICAL FIELD

The present disclosure relates generally to a probe card. More particularly, the present disclosure relates to a probe card that is configured so that a connection member for connecting a circuit board and probes to each other and an insulating part of a probe head are made of the same material, thereby minimizing thermal deformation and thereby preventing a wafer test error even when a temperature change occurs.

BACKGROUND ART

In general, a semiconductor manufacturing process largely includes a fabrication process for forming a pattern on a wafer, an electrical die sorting (EDS) process for testing electrical characteristics of respective chips constituting the wafer, and an assembly process for assembling the wafer on which a pattern is formed to individual chips.

Here, the EDS process is performed to detect defective chips among the chips constituting the wafer. In the EDS process, a probe card which applies electrical signals to the chips constituting the wafer and determines whether the chips are defective on the basis of signals checked from the applied electrical signals is mainly used.

A probe card is a device that connects a semiconductor wafer (or a semiconductor device) and test equipment to test the operation of the semiconductor device, and serves to transmit electricity while connecting probes provided on the probe card to a wafer, and then sort defective semiconductor chips on the basis of feedback signals received thereby.

The probe card used for an electrical test of the semiconductor device may include a circuit board, a connection member, a probe head, and probes. In the probe card, an electrical path is provided through the circuit board, the connection member, and the probe head, and a pattern of a wafer is tested by the probes that directly contact the wafer.

Specifically, in the probe card, the probes in contact with the wafer pass through an insulating part of the probe head, and the circuit board and the probes are electrically connected to each other through the connection member to test the pattern of the wafer.

In general, the EDS process may be performed under a high-temperature environment. Therefore, an overall temperature of the probe card increases during the process. In this case, when the insulating part of the probe head through which the probes pass and the connection member connected to the probes are made of different materials, the insulating part of the probe head and the connection member have different coefficients of thermal expansion. That is, when the overall temperature of the probe card increases, the connection member and the insulating part of the probe head expand to different degrees. As a result, the interval between the probes and the interval between wires connecting the probes and the circuit board to each other may become different, leading to disconnection between the circuit board and the probes. That is, an error may occur in testing the wafer.

An example of a probe card for minimizing such a problem is disclosed in Korean Patent No. 10-1167509 (hereinafter referred to as "related art").

In the related art, an interposer and a probe block through which probes pass are made of the same material such as ceramic or plastic. Therefore, the interposer and the probe block may expand to the same degree when exposed to high temperature. However, such conventional ceramic or plastic is a material having a high coefficient of thermal expansion, so that when the probe card is provided in a high-temperature environment, the probe block and the interposer are thermally deformed, with the result that the probes and a conductive material connecting the probes to each other cannot be fixed in position. In addition, in the case of the conventional ceramic or plastic, mechanical processing such as laser or drill processing is performed to form throughholes allowing passage of the probes, which generates a residual stress, resulting in a problem of deteriorating durability during use of the probe card.

DOCUMENTS OF RELATED ART (Patent Document 1) Korean Patent No. 10-1167509

DISCLOSURE OF INVENTION

Technical Problem

Accordingly, the present disclosure has been made keeping in mind the above problems occurring in the related art, and an objective of the present disclosure is to provide a probe card that is configured so that a connection member for connecting a circuit board and probes to each other and an insulating part of a probe head are made of the same material, thereby minimizing thermal deformation and thereby preventing a wafer test error even when a temperature change occurs.

Still another objective of the present disclosure is to provide a probe card that copes with a fine pitch of electrode pads of a wafer.

Solution to Problem

In order to accomplish the above objectives, according to an aspect of the present disclosure, there is provided a probe card, including: a circuit board; a probe head having a guide plate, and through which a plurality of probes pass; and a connection member electrically connecting the circuit board and the probes to each other, wherein an insulating part of the connection member and the guide plate may be made of an anodic aluminum oxide film formed by anodizing a metal as a base material.

Furthermore, the connection member may be configured as a space transformer.

Furthermore, the connection member may be configured by stacking a plurality of unit anodic aluminum oxide sheets.

Furthermore, the connection member may be configured as an interposer.

Furthermore, the connection member may be configured by stacking a plurality of unit anodic aluminum oxide sheets.

Advantageous Effects of Invention

As described above, a probe card according to the present disclosure is configured so that a connection member for connecting a circuit board and probes to each other and an insulating part of a probe head are made of the same material, thereby making it possible to minimize thermal deformation and thus prevent a wafer test error even when a temperature change occurs.

In addition, it is possible to cope with a fine pitch of electrode pads of a wafer.

BRIEF DESCRIPTION OF DRAWINGS

FIGS. 2A to 2D are views illustrating a method of manufacturing a lower guide plate illustrated in FIG. 1.

FIGS. 3, 4A, and 4B are views each illustrating a laminated state of the lower guide plate illustrated in FIGS. 2A to 2D.

MODE FOR THE INVENTION

Figure 1:
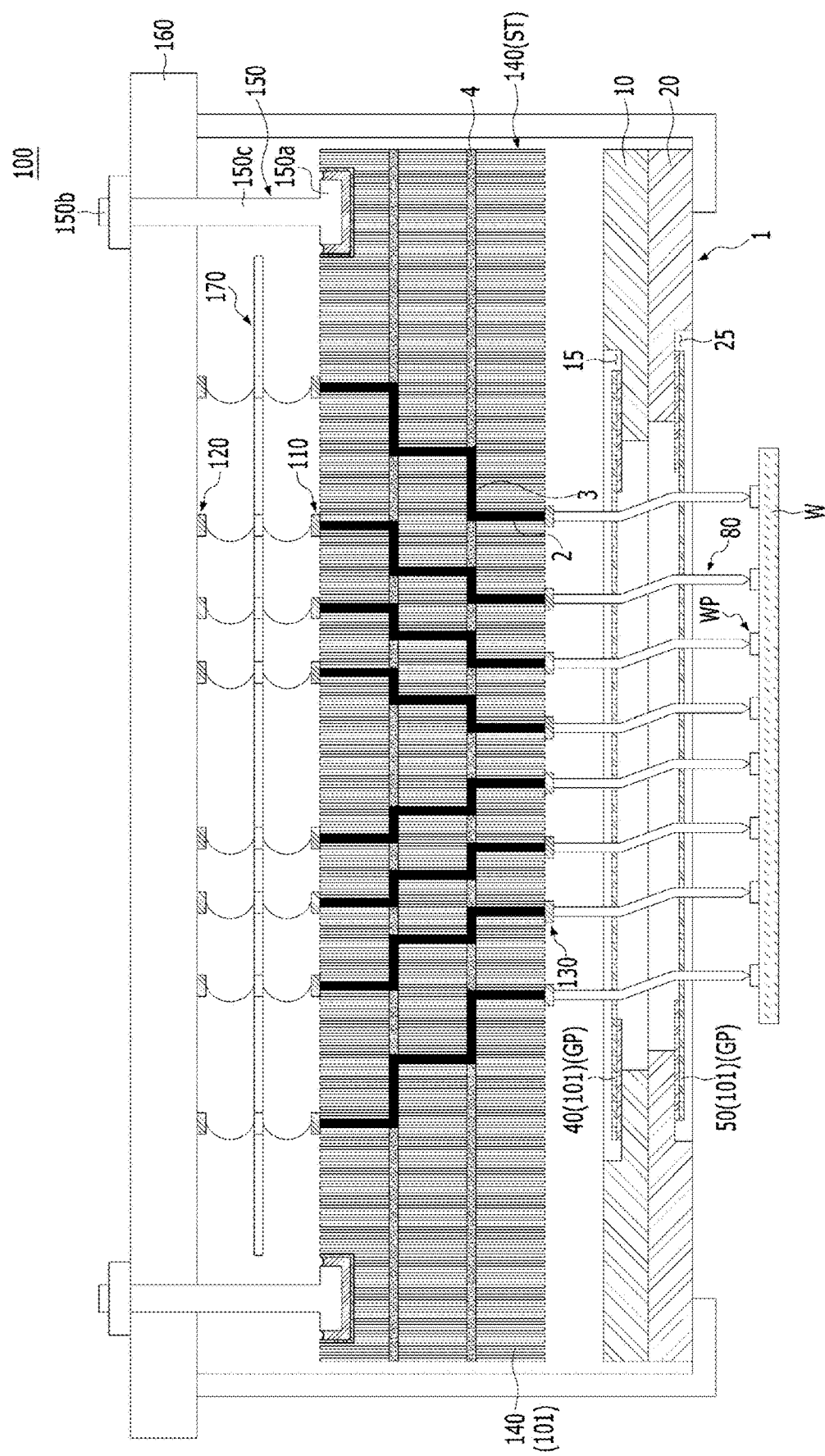
FIG. 1 is a view schematically illustrating a probe card according to a first embodiment of the present disclosure.

Contents of the description below merely exemplify the principle of the present disclosure. Therefore, those of ordinary skill in the art may implement the theory of the present disclosure and invent various apparatuses which are included within the concept and the scope of the present disclosure even though it is not clearly explained or illustrated in the description. Furthermore, in principle, all the conditional terms and embodiments listed in this description are clearly intended for the purpose of understanding the concept of the present disclosure, and one should understand that the present disclosure is not limited to the exemplary embodiments and the conditions.

The above described objectives, features, and advantages will be more apparent through the following detailed description related to the accompanying drawings, and thus those of ordinary skill in the art may easily implement the technical spirit of the present disclosure.

The embodiments of the present disclosure will be described with reference to cross-sectional views and/or perspective views which schematically illustrate ideal embodiments of the present disclosure. For explicit and convenient description of the technical content, thicknesses and widths of members and regions in the figures may be exaggerated. Therefore, variations from the shapes of the illustrations as a result, for example, of manufacturing techniques and/or tolerances, are to be expected.

In addition, a limited number of holes are illustrated in the drawings. Thus, the embodiments should not be construed as limited to the particular shapes of regions illustrated herein but are to include deviations in shapes that result, for example, from manufacturing.

In describing various embodiments, the same reference numerals will be used throughout different embodiments and the description to refer to the same or like elements or parts. In addition, the configuration and operation already described in other embodiments will be omitted for convenience.

Hereinafter, exemplary embodiments of the present disclosure will be described in detail with reference to the accompanying drawings.

FIG. 1 is a view schematically illustrating a probe card 100 according to a first embodiment of the present disclosure. In this figure, for convenience of description, the number and size of a plurality of probes 80 are illustrated exaggeratedly.

Depending on the structure of installing the probes 80 on a connection member 140 (ST) and the structure of the probes 80, the types of the probe card 100 may be classified into a vertical type probe card, a cantilever type probe card, and a micro-electro-mechanical system (MEMS) probe card. In the present disclosure, as an example, a vertical type probe card 100 is illustrated to describe a coupling structure between the connection member 140 (ST) and other peripheral parts. The type of the probe card in which the coupling structure between the connection member 140 (ST) and other peripheral parts is implemented is not limited thereto, and may be the MEMS probe card and the cantilever type probe card.

FIG. 1 illustrates a contact state of electrode pads WP of a wafer W. A test for electrical characteristics of semiconductor devices is performed by approaching the wafer W to the probe card 100 having the plurality of probes 80 on a wiring substrate, and bringing the respective probes 80 into contact with corresponding electrode pads WP on the wafer W. After the probes 80 reach positions where the probes 80 are brought into contact with the electrode pads WP, the wafer W may be further lifted by a predetermined height toward the probe card 100. This process may be overdrive.

As illustrated in FIG. 1, the probe card 100 according to the present disclosure may include: the connection member 140 (ST) made of an anodic aluminum oxide film 101, and including a vertical wiring part 2, a horizontal wiring part 3 connected to the vertical wiring part 2, and a probe connection pad 130 electrically connected to each of the plurality of probes 80; and a coupling member 150 having a first end 150a fixed to a surface of the connection member 140 (ST) and a second end 150b coupled to the circuit board 160 provided above the connection member 140 (ST). In this case, the coupling member 150 may be configured as a bolt, but is not limited thereto.

As illustrated in FIG. 1, the connection member 140 may be configured as a space transformer ST. The circuit board 160 may be provided above the space transformer 140 (ST), and the probe head 1 on which the plurality of probes 80 are provided may be provided below the space transformer 140 (ST). In other words, the space transformer 140 (ST) may be located between the circuit board 160 and the probe head 1. The space transformer 140 (ST) may be coupled to peripheral parts by the coupling member 150.

The space transformer 140 (ST) coupled to the circuit board 160 by the coupling member 150 may be electrically connected thereto by a connection member 170 interposed between the circuit board 160 and the space transformer 140 (ST). Specifically, a first connection member connection pad 110 may be provided on an upper surface of the space transformer 140 (ST), and a second connection member connection pad 120 may be provided on a lower surface of the circuit board 160. Therefore, the connection member 170 interposed between the space transformer 140 (ST) and the circuit board 160 may be joined to the first connection member connection pad 110 and the second connection member connection pad 120 to form an electrical connection between the space transformer 140 (ST) and the circuit board 160.

An insulating part 41 of the space transformer 140 (ST) may be made of the anodic aluminum oxide film 101. The anodic aluminum oxide film 101 refers to a film formed by anodizing a metal that is a base material, and pores 101a refer to pores formed in the anodic aluminum oxide film 101 during the process of forming the anodic aluminum oxide film 101 by anodizing the metal. For example, in a case where the metal as the base material is aluminum (Al) or an aluminum alloy, the anodization of the base material forms the anodic aluminum oxide film 101 consisting of anodized aluminum oxide ($Al_2O_3$) on a surface SF of the base material. The anodic aluminum oxide film 101 formed as such has a barrier layer BL in which no pores 101a are formed and a porous layer PL in which pores 101a are formed. The barrier layer BL is positioned on the base material, and the porous layer PL is positioned on the barrier layer BL. In a state in which the anodic aluminum oxide film 101 having the barrier layer BL and the porous layer PL is formed on the surface SF of the base material, when the base material is removed, only the anodic aluminum oxide film 101 consisting of anodized aluminum oxide ($Al_2O_3$) remains. The resulting anodic aluminum oxide film 101 has the pores 101a that have a uniform diameter, are formed in a vertical shape, and have a regular arrangement. In this case, when the barrier layer BL is removed, a structure in which the pores 101a vertically pass through the anodic aluminum oxide film 101 from top to bottom is formed.

The anodic aluminum oxide film 101 has a coefficient of thermal expansion of 2 to 3 ppm/° C. This may result in a small degree of deformation due to temperature. In addition, the coefficient of thermal expansion of the anodic aluminum oxide film 101 is close to the coefficient of thermal expansion of the wafer W as an object to be tested, so that positional misalignment between the probes 80 and the electrode pads WP may be minimized even under a high-temperature environment.

According to the present disclosure, by configuring the space transformer 140 ST using the anodic aluminum oxide film 101, the space transformer 140 (ST) having a small degree of thermal deformation under a high-temperature environment may be implemented.

The space transformer 140 (ST) may have a structure in which a plurality of layers are stacked. Specifically, each of the layers of the space transformer 140 (ST) may have vertical wiring parts 2, and the vertical wiring parts 2 of an upper layer thereof and the vertical wiring parts 2 of a lower layer thereof may be electrically connected to each other through horizontal wiring parts 3. In this case, the interval between the vertical wiring parts 2 of an uppermost layer of the space transformer 140 (ST) may be the same as that between second connection member connection pads 120 provided on the circuit board 160, and the interval between the respective vertical wiring parts 2 of the plurality of layers thereof may become gradually narrow from the uppermost layer toward the lower layer. In this case, the interval between the vertical wiring parts 2 of a lowermost layer of the space transformer 140 (ST) may be the same as that between the respective probe connection pads 130 provided under the space transformer 140 (ST). Therefore, the interval between the probe connection pads 130 provided under the space transformer 140 (ST) may be narrower than that between the second connection member connection pads 120. In other words, by providing the space transformer 140 (ST) between the circuit board 160 and the probe head 1, the plurality of probes 80 may be arranged at a narrower interval. This means that it is possible to implement a fine pitch of the probes 80 through the space transformer 140 (ST).

The probe head 1 is provided below the space transformer 140 (ST). The probe head 1 supports the probes 80 and includes a plurality of guide plates GP each having a guide hole GH. The probe head 1 may be manufactured by means of bolt fastening as an example.

The probe head 1 may have a structure in which an upper guide plate 40 and a lower guide plate 50 are sequentially provided. In this case, at least one of the upper guide plate 40 and the lower guide plate 50 may be made of an anodic aluminum oxide film 101.

The upper guide plate 40 and the lower guide plate 50 may be supported by a first plate 10 and a second plate 20, respectively. Specifically, the second plate 20 may be provided under the first plate 10, each of the first plate 10 and the second plate 20 may have a central space for allowing passage of the probes 80.

Specifically, the upper guide plate 40 may be provided in an upper seating region 15 formed on an upper surface of the first plate 10, and the lower guide plate 50 may be provided in a lower seating region 25 formed on a lower surface of the second plate 20. In this case, the upper seating region 15 may be configured as a concave recess in the upper surface of the first plate 10, and the lower seating region 25 may be configured as a concave recess in the lower surface of the second plate 20. However, since the concave recess shape of the upper seating region 15 and the lower seating region 25 is illustrated as an example, the shape thereof is not limited thereto. Therefore, the upper seating region 15 and the lower seating region 25 may be formed in a suitable shape to allow the upper guide plate 40 and the lower guide plate 50 to be provided on the upper surface of the first plate 10 and the lower surface of the second plate 20 more stably.

FIGS. 2A to 2D are views illustrating a method of manufacturing a lower guide plate illustrated in FIG. 1.

A guide plate GP illustrated in FIGS. 2A to 2D may be at least one of an upper guide plate 40 and a lower guide plate 50, and hereinafter will be described as being the lower guide plate 50 as an example. In FIGS. 2A to 2D, for convenience of explanation, a portion of the lower guide plate 50 having a lower guide hole 54 is enlarged and schematically illustrated.

Figure 2A:
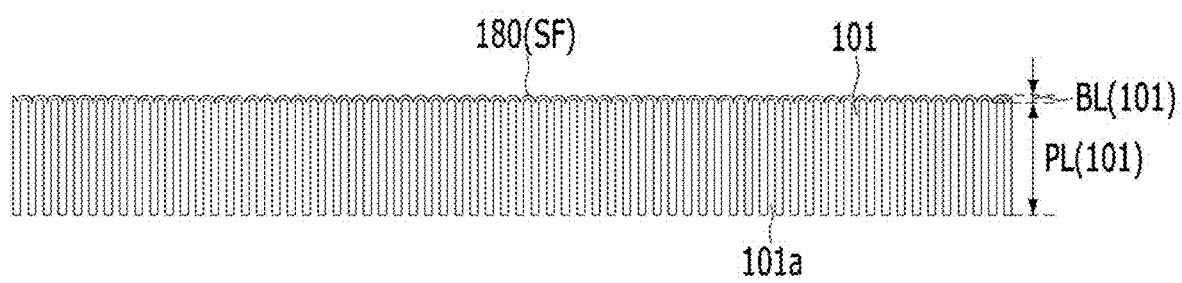

As illustrated in FIG. 2A, an anodic aluminum oxide film 101 including pores 101a may be provided. Then, as illustrated in FIG. 2B, a film 5 may be provided under the anodic aluminum oxide film 101. In this case, the anodic aluminum oxide film 101 may be provided in a state in which a barrier layer BL is not removed, and the barrier layer BL may be provided on an upper surface 180 of the anodic aluminum oxide film 101 on which the film 5 is not provided. That is, a porous layer PL may be provided between the barrier layer BL and the film 5. Since the upper surface 180 of the lower guide plate 50 may be configured as the barrier layer BL, a problem in which particles flow into the lower guide plate 50 through the pores 101a may be prevented. In addition, inner walls of openings of the guide plate GP, into which front ends of a plurality of probes 80 are first inserted during insertion of the probes 80, may be positioned in the barrier layer BL having a high degree of density, thus having a high degree of durability. This may prevent abrasion of inner walls of openings of guide holes GH that may occur simultaneously with the insertion of the probes 80. As a result, a particle generation problem due to abrasion of the inner walls of the openings of the guide holes GH may be minimized.

As illustrated in FIG. 2C, at least a portion of the film 5 may be patterned by a photo process. Therefore, a plurality of film holes 5a may be formed in the film 5.

As illustrated in FIG. 2D, the anodic aluminum oxide film 101 may be etched through the film holes 5a, which are areas removed by patterning. Therefore, by such etching, a plurality of lower guide holes 54 corresponding to the film holes 5a may be formed in the anodic aluminum oxide film 101. That is, the lower guide holes 54 may be holes having the same size as the film holes 5a.

The lower guide plate 50 in which the lower guide holes 54 are formed may be provided on a second plate 20 after the film 5 is removed. However, without being limited thereto, the lower guide plate 50 may be provided on the second plate 20, with the film 5 provided thereon.

The film 5 may be made of a photosensitive material, and preferably, the film 5 is a photosensitive film capable of lithography. In addition, the film 5 may be a material capable of adhesion, and thus, the anodic aluminum oxide film 101 and the film 5 may be bonded without use of a separate adhesive means. The film 5 may be an epoxy, PI, or acrylate-based photoresist. As a more specific example, the film 5 may be SU-8, which is an epoxy-based resist in which eight epoxy groups are included in a single molecule.

In a conventional guide plate, insertion holes for probes are formed by mechanical processing such as laser or drilling processing. Therefore, a residual stress is generated when mechanically processing the insertion holes in the guide plate, resulting in a problem of deteriorating durability during use of a probe card. In addition, the holes formed by laser processing are not vertical, resulting in a problem in which a clearance occurs after insertion of the probes. On the contrary, in the lower guide plate 50 according to the present disclosure, since the lower guide holes 54 are formed by etching, the problems caused by mechanical processing may be prevented, and the lower guide holes 54 may have inner walls that are vertical in a straight line. Therefore, since the lower guide plate 50 may be made of a light-transmitting material, this may facilitate insertion of the probes 80, and since the inner walls of the lower guide holes 54 are straight, a clearance may be prevented from occurring.

FIGS. 3, 4A, and 4B are views each illustrating a laminated state of the lower guide plate illustrated in FIGS. 2A to 2D.

As illustrated in FIGS. 3, 4A, and 4B, as an example, a lower guide plate 50 may be configured by stacking a plurality of unit anodic aluminum oxide sheets 200. In this case, each of upper and lower surfaces 180 and 190 of the lower guide plate 50 may be configured as a barrier layer BL that is formed under a porous layer PL, which is formed by anodizing metal and having regularly arranged pores 101a, and closes one ends of the pores 101a.

Each of the anodic aluminum oxide sheets 200 may include the porous layer PL made of an anodic aluminum oxide film 101 and having the pores 101a, and the barrier layer BL formed under the porous layer PL to close one ends of the pores 101a. Therefore, the anodic aluminum oxide sheet 200 may have a structure in which upper and lower surfaces thereof are asymmetrical.

There may be a density difference between the barrier layer BL in which no pores 101a exist and the porous layer PL in which the regularly arranged pores 101a exist. Therefore, when the upper guide plate 40 or the lower guide plate 50 is configured with only one unit anodic aluminum oxide sheet 200 having an asymmetric structure, warpage deformation may occur under a high-temperature environment.

In addition, a plurality of lower guide holes 54 for allowing insertion of a plurality of probes 80 may be formed in the lower guide plate 50. However, when surfaces SF of the lower guide plate 50 are configured as the respective porous layers PL having the pores 101a, there may be a problem in which fine particles are collected therein, and then discharged when the probes 80 are inserted through guide holes GH.

In addition, when the surfaces SF of the lower guide plate 50 are configured as the porous layers PL, the porous layers PL, which are relatively weak in durability due to their low density, may be abraded during insertion of the probes 80 through the guide holes GH, thereby generating particles. These particles may be discharged in conjunction with the insertion of the probes 80 to cause a problem of a defect in test function of the probe card 100.

Therefore, in the present disclosure, the lower guide plate 50 having the guide holes GH for the insertion of the probes 80 may be configured by stacking the plurality of unit anodic aluminum oxide sheets 200, and the surfaces SF may be configured as the respective barrier layers BL that are symmetrical.

This may ensure a uniform density of the upper and lower surfaces 180 and 190 of the lower guide plate 50, thereby preventing warpage deformation.

In addition, by the barrier layers BL forming the surfaces SF of the lower guide plate 50, a problem in which particles flow into the lower guide plate 50 through the pores 101a may be prevented.

In addition, inner walls of openings of the guide holes GH, into which front ends of the probes 80 are first inserted during insertion of the probes 80, may be positioned in the barrier layer BL having a high degree of density, thus having a high degree of durability. This may prevent abrasion of the inner walls of the openings of the guide holes GH that may occur simultaneously with the insertion of the probes 80. As a result, a particle generation problem due to abrasion of the inner walls of the openings of the guide holes GH may be minimized.

The plurality of unit anodic aluminum oxide sheets 200 may be joined together by a suitable method of joining the unit anodic aluminum oxide sheets 200. As an example, the unit anodic aluminum oxide sheets 200 may be joined together by a film 5.

FIG. 3 illustrates a laminated structure in the case where a lower guide plate 50 is composed of an even number of unit anodic aluminum oxide sheets 200. As an example, first and second unit anodic aluminum oxide sheets 201 and 202 may be sequentially stacked.

In addition, FIGS. 4A and 4B illustrate various embodiments of a laminated structure in the case where a lower guide plate 50 is composed of an odd number of unit anodic aluminum oxide sheets 200. As an example, first to third unit anodic aluminum oxide sheets 201, 202, and 203 may be sequentially stacked.

As illustrated in FIG. 4A, in the lower guide plate 50, the first unit anodic aluminum oxide sheet 201 forming a lower surface 190 may be made of an anodic aluminum oxide film 101 having a porous layer PL with pores 101a and a barrier layer BL under the porous layer PL. In addition, a third unit anodic aluminum oxide sheet 203 forming an upper surface 180 may be made of an anodic aluminum oxide film 101 having a porous layer PL and a barrier layer BL on the porous layer PL. The second unit anodic aluminum oxide sheet 202 having a barrier layer BL may be provided between the first and third unit anodic aluminum oxide sheets 201 and 203.

As illustrated in FIG. 4A, the lower guide plate 50 may have a structure in which the first unit anodic aluminum oxide sheet 201 is provided so that the barrier layer BL is positioned under the porous layer PL, the second unit anodic aluminum oxide sheet 202 is stacked on the first unit anodic aluminum oxide sheet 201 so that the barrier layer BL is positioned under a porous layer PL, and the third unit anodic aluminum oxide sheet 203 is stacked on the second unit anodic aluminum oxide sheet 202 so that the barrier layer BL is positioned on the porous layer PL.

Due to the first and third unit anodic aluminum oxide sheets 201 and 203, the lower guide plate 50 may have the upper and lower surfaces 180 and 190 configured as the barrier layers BL.

In addition, as illustrated in FIG. 4B, the second unit anodic aluminum oxide sheet 202 may be provided, with the barrier layer BL removed. That is, the second unit anodic aluminum oxide sheet 202 may be provided between the first and third unit anodic aluminum oxide sheets 201 and 203 so that only the porous layer PL is provided, and the porous layer PL of the second unit anodic aluminum oxide sheet 202 may be closed by the first and third unit anodic aluminum oxide sheets 201 and 203.

As such, the first and third unit anodic aluminum oxide sheets 201 and 203, which form surfaces SF including the upper and lower surfaces 180 and 190 of the lower guide plate 50, may have a structure in which the barrier layers BL thereof are symmetrical, while the structure of the second unit anodic aluminum oxide sheet 202 provided between the first and third unit anodic aluminum oxide sheets 201 and 203 may be changed and implemented in various forms.

As illustrated in FIGS. 3, 4A, and 4B, since the lower guide plate 50 may be configured so that the surfaces SF are configured as the barrier layers BL having a symmetrical structure, the upper and lower surfaces 180 and 190 of the lower guide plate 50 may have a uniform density. This may prevent the problem of warpage deformation.

In addition, since the surfaces SF of the lower guide plate 50 except for the lower guide holes 54 are closed by the barrier layers BL, a problem in which particles flow into the lower guide plate 50 may be prevented.

In addition, since inner walls of openings of the lower guide holes 54 may be positioned in the barrier layer BL having a high degree of density, durability against abrasion occurring when the probes 80 are inserted through the lower guide holes 54 may be relatively high. This may minimize the problem of particle generation occurring during the insertion of the probes 80.

In the present embodiment, although only the stacking method of the lower guide plate 50 has been described for convenience of explanation, the upper guide plate 40 may have the same laminated structure as the lower guide plate 50.

Referring to FIG. 1 again, the circuit board 160 may be provided above the connection member 140 made of the anodic aluminum oxide film 101, and the probe head 1 including the upper and lower guide plates each made of the anodic aluminum oxide film 101 may be provided below the connection member 140.

The connection member 140 may be made of the anodic aluminum oxide film 101, and thus may be configured using a plurality of unit anodic aluminum oxide sheets 200. Specifically, the connection member 140 may be formed in the same manner as in the case of the upper and lower guide plates 40 and 50, and may have a structure in which first to third unit anodic aluminum oxide sheets are stacked as in the case of the upper and lower guide plates 40 and 50. However, the structure of the connection member 140 is not limited thereto.

In the present disclosure, the first end 150a of the coupling member 150 may be fixed to the surface of the space transformer ST, which is the connection member 140, and the second end 150b thereof may be coupled to the circuit board 160. Due to this structure, the functions of controlling flatness of the space transformer ST and supporting the space transformer ST may be simultaneously performed. This may realize an efficient structure that does not require the provision of separate components for controlling the flatness of the space transformer ST and supporting the space transformer ST.

In such a structure, the space transformer ST and the upper and lower guide plates 40 and 50 that are directly related to the probes 80 performing a practical probing process may be made of the same anodic aluminum oxide film 101, thereby improving structural efficiency, while minimizing thermal deformation under a high-temperature environment. Therefore, the present disclosure may have an effect of minimizing functional errors (specifically, test errors occurring due to misalignment between the probes 80 and the probe connection pads 130 of the space transformer ST) due to thermal deformation.

Figure 5:
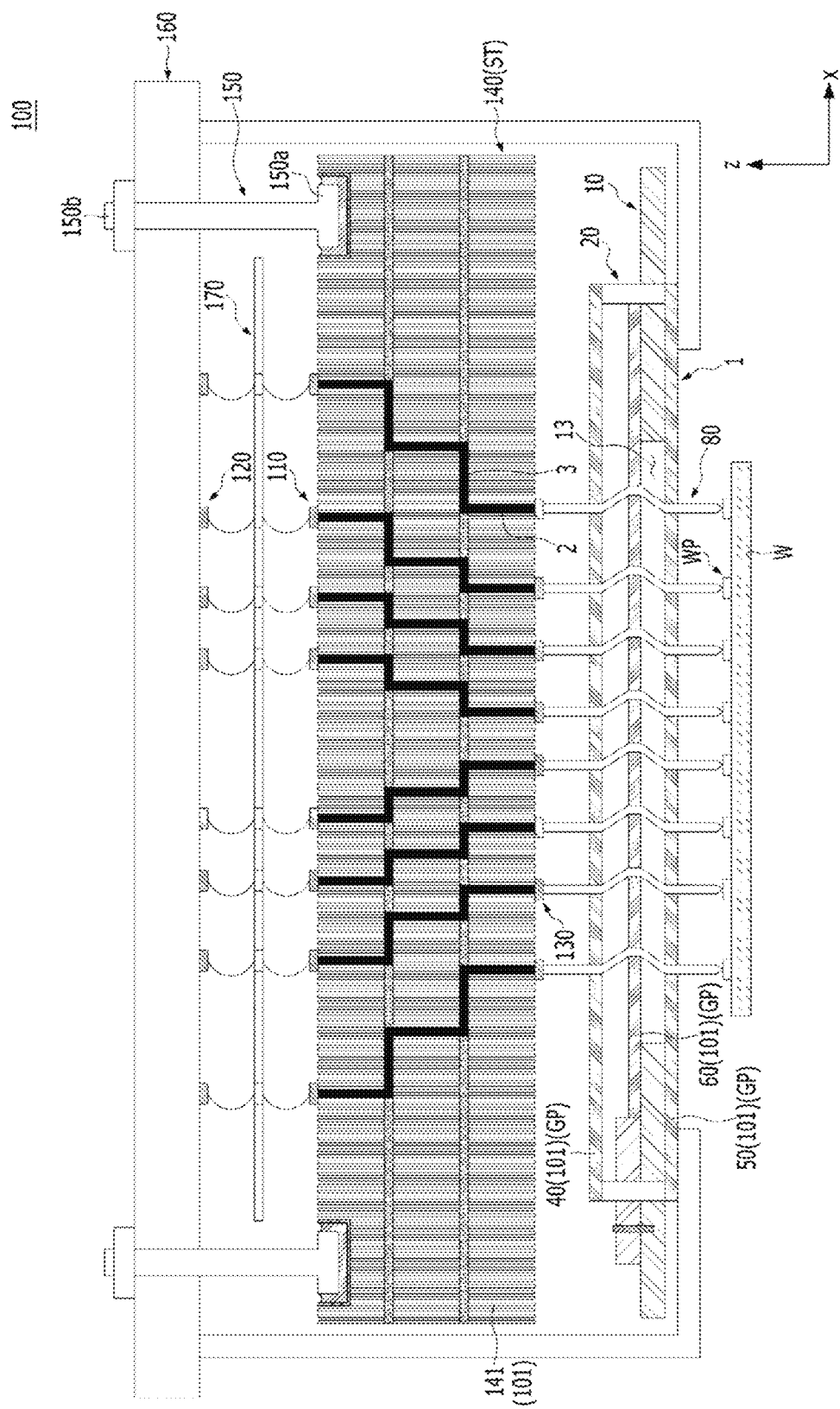
FIG. 5 is a view schematically illustrating a modified example of the probe card illustrated in FIG. 1.

FIG. 5 is a view schematically illustrating a modified example of the probe card illustrated in FIG. 1.

As illustrated in FIG. 5, a probe card 100 includes an intermediate guide plate 60 between an upper guide plate 40 and a lower guide plate 50. Specifically, the intermediate guide plate 60 may be provided at a side of a second plate 20. However, the position of the intermediate guide plate 60 is not limited thereto, and may be provided at a side of a first plate 10.

A plurality of probes 80 may sequentially pass through the upper guide plate 40, the intermediate guide plate 60, and the lower guide plate 50 to be provided toward a wafer W. In this case, the probes 80 may pass through a guide plate GP in a vertical shape and then, as illustrated in FIG. 5, may be elastically deformed in one direction.

Specifically, when the vertical probes 80 pass through the guide plate GP, the intermediate guide plate 60 may be moved in one direction. Therefore, the probes 80 may be elastically deformed in conjunction with the movement of the intermediate guide plate 60. In the present embodiment, although it is described as an example that the intermediate guide plate 60 is moved in the right direction and an intermediate portion of each of the probes 80 is deformed in the right direction thereby, the moving direction of the intermediate guide plate 60 is not limited thereto.

By providing the intermediate guide plate 60 between the upper guide plate 40 and the lower guide plate 50, the probe card 100 may support the probes 80 more effectively.

Hereinafter, a second embodiment of the present disclosure will be described. Compared to the first embodiment, the second embodiment has a difference in the shape of a connection member. Therefore, the difference will be mainly described, and the description and reference numerals of the first embodiment will be used for the same parts.

Figure 6:
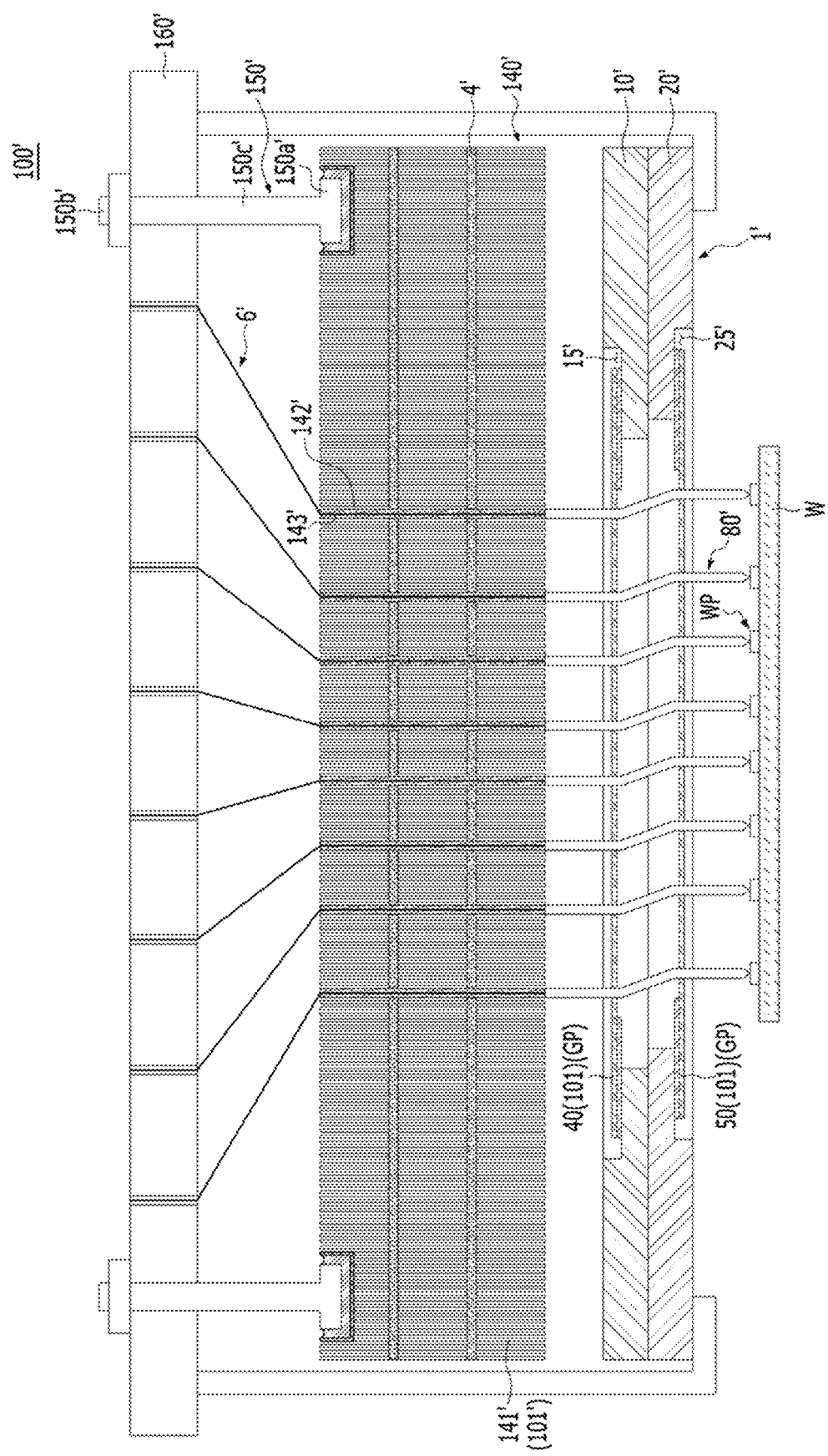
FIG. 6 is a view schematically illustrating a probe card according to a second embodiment of the present disclosure.

FIG. 6 is a view schematically illustrating a probe card according to the second embodiment of the present disclosure.

Referring to FIG. 6, a probe card 100' includes a connection member 140' between a probe head 1' and a circuit board 160'. In this case, the connection member 140' is configured as an interposer.

An insulating part 141' of the connection member 140' may be made of an anodic aluminum oxide film 101'. In this case, the connection member 140' may have a structure in which a plurality of anodic aluminum oxide sheets are stacked.

The connection member 140' may have a plurality of through-holes 142'. Each of the plurality of through-holes 142' is a space for allowing passage of a wire 6', and the through-holes 142' may be arranged at a regular interval. In addition, each of a plurality of layers of the connection member 140' may have the same number of through-holes 142'. In the present embodiment, it is illustrated that the respective through-holes 142' of the plurality of layers of the connection member 140' are arranged at the same interval so as to be vertically connected to each other. However, the shape of the through-holes 142' of the connection member 140' is not limited thereto, and the through-holes 142' of the plurality of layers of the connection member 140' may be arranged at different intervals. For example, the interval between the through-holes 142' of an uppermost layer of the connection member 140' may be wider than that between the through-holes 142' of a lowermost layer thereof.

In the connection member 140' made of the anodic aluminum oxide film 101', the through-holes 142' may be formed by etching. Therefore, the connection member 140' may be prevented from experiencing a problem caused by mechanical processing, and the through-holes 142' may have inner walls that are vertical in a straight line.

The connection member 140' and the circuit board 160' may be electrically connected to each other through the respective wires 6'. Specifically, a side of the circuit board 160' and a side of the connection member 140' may be coupled to each other by a coupling member 150', and the wires 6' passing through the circuit board 160' may pass through the connection member 140'. That is, first ends of the wires 6' may be provided in the circuit board 160', and second ends of the wires 6' may be provided in the connection member 140'. In this case, the second ends of the wires 6' passing through the connection member 140' may be in contact with a plurality of probes 80'. That is, the circuit board 160' and the probes 80' may be electrically connected to each other through the wires 6'.

The first ends of the wires 6' may be fixed to the circuit board 160'. For example, the first ends of the wires 6' may be fixed to the circuit board 160' by soldering, but a method of fixing the circuit board 160' and the wires 6' is not limited thereto.

The wires 6' may pass through the circuit board 160' and then through the through-holes 142' of the connection member 140'. Specifically, the wires 6' may sequentially pass through the through-holes 142' of the plurality of layers of the connection member 140'.

After the wires 6' pass through the through-holes 142', a charging part 143' may be charged in each of the through-holes 142'. Each of the wires 6' may have a smaller thickness than each of the through-holes 142', so that the wire 6' may not be fixed within the through-hole 142'. Therefore, by charging the separate charging part 143' in a space of each of the through-holes 142' except for the wire 6', the wire 6' may be effectively fixed within the through-hole 142'.

The charging part 143' may be configured as an epoxy-based adhesive to more effectively fix the wire 6', but is not limited thereto.

The circuit board 160' may have wire through-holes (not illustrated) that are arranged at a wider interval than the through-holes 142' of the connection member 140'. Therefore, in order for the wires 6' passing through the circuit board 160' to pass through the through-holes 142' of the connection member 140', the wires 6' may be provided in a form bent in one direction in a space between the circuit board 160' and the connection member 140'. That is, the interval between the wires 6' in the connection member 140' may be narrower than in the circuit board 160', and accordingly, the interval between the probes 80' may become narrower, thereby realizing a fine pitch of the probe head 1'.

In addition, the connection member 140' configured as the interposer and a guide plate GP of the probe head 1' may be made of the same anodic aluminum oxide film 101, thereby improving structural efficiency, while minimizing thermal deformation under a high-temperature environment. Therefore, the present disclosure may have an effect of minimizing functional errors (specifically, test errors occurring due to misalignment between the probes 80' and the wires 6' of the interposer 140') due to thermal deformation.

Figure 7:
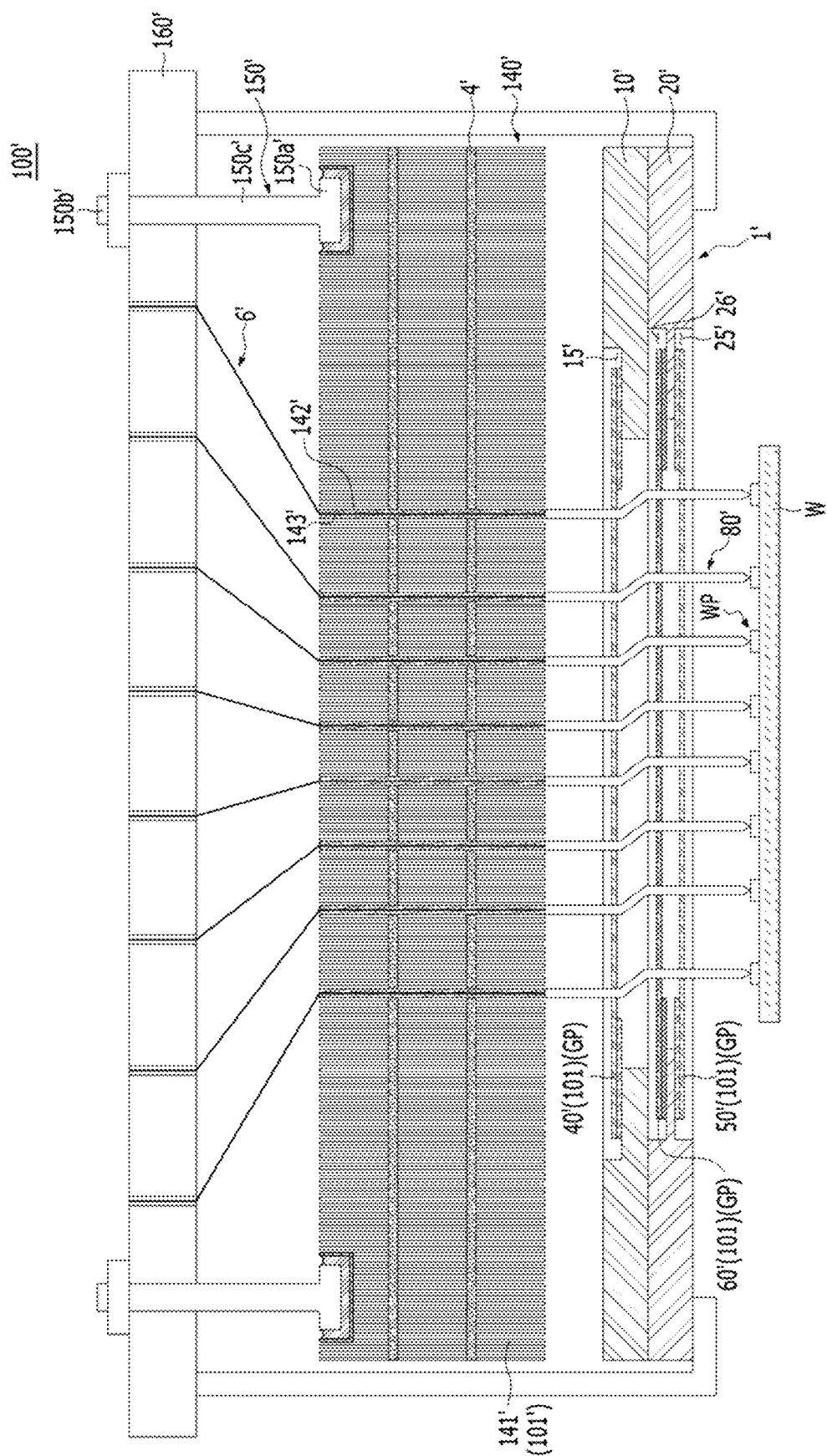
FIG. 7 is a view schematically illustrating a modified example of the probe card illustrated in FIG. 6.

FIG. 7 is a view schematically illustrating a modified example of the probe card illustrated in FIG. 6.

As illustrated in FIG. 7, a probe card 100' includes an intermediate guide plate 60' between an upper guide plate 40' and a lower guide plate 50'. Specifically, the intermediate guide plate 60' may be provided at a side of a second plate 20'. However, the position of the intermediate guide plate 60' is not limited thereto, and may be provided at a side of a first plate 10'.

A plurality of probes 80' may sequentially pass through the upper guide plate 40', the intermediate guide plate 60', and the lower guide plate 50' to be provided toward a wafer W. In this case, the probes 80' may pass through a guide plate GP in a vertical shape and then, as illustrated in FIG. 7, may be elastically deformed in one direction.

Specifically, when the vertical probes 80' pass through the guide plate GP, the intermediate guide plate 60' may be moved in one direction. Therefore, the probes 80' may be elastically deformed in conjunction with the movement of the intermediate guide plate 60'. In the present embodiment, although it is described as an example that the intermediate guide plate 60' is moved in the right direction and an intermediate portion of each of the probes 80' is deformed in the right direction thereby, the moving direction of the intermediate guide plate 60' is not limited thereto.

By providing the intermediate guide plate 60' between the upper guide plate 40' and the lower guide plate 50', the probe card 100' may support the probes 80' more effectively.

While particular embodiments of the probe card according to the present disclosure have been described, it is merely illustrative and is not intended to limit the scope of the present disclosure and should be construed as having widest range based on the spirit of present disclosure. Those of ordinary skill in the art may combine and substitute the disclosed embodiments to perform a particular pattern of shape that has not been noted, but it is also within the scope of the present disclosure. It will be apparent to those of ordinary skill in the art that various changes and modifications may be readily made without departing from the spirit and scope of the present disclosure.

DESCRIPTION OF THE REFERENCE NUMERALS IN THE DRAWINGS 1, 1': probe head 100, 100': probe card
101, 101': anodic aluminum oxide film
101a, 101a': pore
110: first connection member connection pad
120: second connection member connection pad
130: probe connection pad
140, 140': connection member
150, 150': coupling member 160, 160': circuit board
170: connection member 180: upper surface
190: lower surface 2: vertical wiring part
20, 20': second plate 3: horizontal wiring part
40, 40': upper guide plate
50, 50': lower guide plate
60, 60': intermediate guide plate
80, 80': probe
BL: barrier layer GH: guide hole
GP: guide plate PL: porous layer
SF: surface ST: space transformer
W: wafer WP: electrode pad

The invention claimed is:

1. A probe card, comprising:
a circuit board;
a probe head having a guide plate, and through which a plurality of probes pass; and
a connection member electrically connecting the circuit board and the probes to each other,
wherein an insulating part of the connection member and the guide plate are made of an anodic aluminum oxide film formed by anodizing a metal as a base material,
wherein each of the guide plate and the connection member is configured by stacking a plurality of unit anodic aluminum oxide sheet.

2. The probe card of claim 1, wherein the connection member is configured as a space transformer.

3. The probe card of claim 1, wherein the connection member is configured as an interposer.

* * * * *